United States Patent
Lu et al.

(10) Patent No.: US 9,666,483 B2
(45) Date of Patent: May 30, 2017

(54) INTEGRATED CIRCUIT HAVING THINNER GATE DIELECTRIC AND METHOD OF MAKING

(75) Inventors: Chih-Hung Lu, Zhudong Township (TW); Song-Bor Lee, Zhubei (TW); Ching-Kun Huang, Chubei (TW); Ching-Chen Hao, Zhubei (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 450 days.

(21) Appl. No.: 13/371,168

(22) Filed: Feb. 10, 2012

(65) Prior Publication Data

US 2013/0207200 A1  Aug. 15, 2013

(51) Int. Cl.
*H01L 27/088* (2006.01)
*H01L 21/8234* (2006.01)

(52) U.S. Cl.
CPC ............................. *H01L 21/823462* (2013.01)

(58) Field of Classification Search
USPC ............... 257/324, 369, 393, 401, 411, 506; 438/250, 694
See application file for complete search history.

(56) References Cited

U.S. PATENT DOCUMENTS

| | | | | |
|---|---|---|---|---|
| 5,759,901 A * | 6/1998 | Loh | ................ | H01L 21/26586 438/217 |
| 6,597,046 B1 * | 7/2003 | Chau | ............... | H01L 21/823462 257/406 |
| 6,620,679 B1 * | 9/2003 | Tzeng | ............... | H01L 27/10873 257/E21.654 |
| 6,836,026 B1 * | 12/2004 | Ali | .......................... | H01L 24/06 257/202 |
| 6,925,627 B1 * | 8/2005 | Longway | ............ | G06F 17/5077 257/207 |
| 8,402,402 B1 * | 3/2013 | Fender | ................ | G06F 17/5036 716/106 |
| 2005/0079674 A1 * | 4/2005 | Zheng | ................... | H01L 27/105 438/258 |
| 2005/0136632 A1 * | 6/2005 | Rotondaro | ........ | H01L 21/28185 438/591 |
| 2006/0193186 A1 * | 8/2006 | Sakihama | ........... | G06F 17/5068 365/200 |
| 2007/0018253 A1 * | 1/2007 | Liaw | ................... | H01L 27/0203 257/369 |
| 2007/0136617 A1 * | 6/2007 | Kanno | .................. | G06F 1/3203 713/320 |
| 2008/0147976 A1 * | 6/2008 | Bienek | ............... | G06F 12/0846 711/122 |

(Continued)

*Primary Examiner* — Jaehwan Oh
(74) *Attorney, Agent, or Firm* — Hauptman Ham, LLP

(57) ABSTRACT

An integrated circuit including a first transistor having a first gate dielectric layer with a first thickness. The integrated circuit also includes a second transistor having a second gate dielectric layer with a second thickness and the second transistor is configured to electrically connect to the first transistor. The integrated circuit also includes a third transistor having a third gate dielectric layer with a third thickness and the third transistor is configured to electrically connect to at least one of the first transistor or the second transistor. The first thickness, the second thickness and the third thickness of the integrated circuit are all different.

19 Claims, 8 Drawing Sheets

(56) References Cited

U.S. PATENT DOCUMENTS

| | | | |
|---|---|---|---|
| 2008/0268630 A1* | 10/2008 | Khan | H01L 21/31144 438/587 |
| 2008/0305590 A1 | 12/2008 | Wang et al. | |
| 2009/0031088 A1* | 1/2009 | Donley | G06F 12/0862 711/147 |
| 2009/0289323 A1* | 11/2009 | Tessitore | G06F 1/3203 257/506 |
| 2010/0238752 A1* | 9/2010 | Fujimoto | G11C 8/16 365/226 |
| 2010/0271118 A1* | 10/2010 | Bhattacharya | H03K 17/0822 327/543 |
| 2010/0308415 A1* | 12/2010 | Herberholz | H01L 27/0922 257/369 |
| 2010/0332859 A1* | 12/2010 | Trantham | G06F 1/26 713/300 |
| 2011/0057252 A1* | 3/2011 | Park | H01L 21/823462 257/324 |
| 2011/0068413 A1* | 3/2011 | Liaw | G11C 11/412 257/393 |
| 2011/0129037 A1* | 6/2011 | Staszewski | H03F 3/217 375/316 |
| 2011/0260318 A1* | 10/2011 | Eisenstadt | G06F 17/5054 257/737 |
| 2011/0261609 A1* | 10/2011 | Seshadri | G11C 11/417 365/154 |
| 2012/0034783 A1* | 2/2012 | Entalai | H01L 21/76232 438/694 |
| 2012/0226866 A1* | 9/2012 | Bozek | G06F 9/45558 711/122 |
| 2014/0063943 A1* | 3/2014 | Nagashima | G11C 16/30 365/185.08 |

* cited by examiner

US 9,666,483 B2

INTEGRATED CIRCUIT HAVING THINNER GATE DIELECTRIC AND METHOD OF MAKING

BACKGROUND

Size reduction in metal oxide semiconductor (MOS) transistors has resulted in improved speed, performance and density of transistors. However, in some instances, integrated circuits (ICs) include critical regions where even greater switching speed of MOS transistors is desirable for the ICs to perform as intended. A critical region, for example, is a circuit path having a larger number of comparisons, with respect to other non-critical regions, where the speed of the comparisons is increased so that an output of the critical region occurs at substantially the same time as an output from a different circuit having fewer comparisons. MOS transistor speed is substantially inversely proportional to a threshold voltage of the MOS transistor. That is as the threshold voltage decreases, switching speed for the MOS transistor increases.

One way to increase speed in the critical regions of ICs is to modify a pocket implantation region of the MOS transistors. Modification includes changing the size or dopant concentration of the pocket implantation region. Increased speed through modifying pocket implantation regions; however, increases current leakage exponentially with increased speed. Increased current leakage increases the power consumption of the IC. Also, additional implantation masks are needed for creating or modifying the pocket implantation regions. The use of additional masks increases production time and resources needed to produce the MOS transistors.

Another way to increase speed in the IC overall is to decrease the thickness of the gate dielectric of all the MOS transistors. Thinner gate dielectrics, however, also increase current leakage at speeds below about 1200 MHz. Thinner gate dielectrics are also susceptible to reliability issues such as negative bias temperature instability (NBTI) and hot carrier injection (HCI), which permanently alter the threshold voltage. Thinner gate dielectrics are also vulnerable to breakdown at high power levels, making thin gate dielectrics unsuitable for some MOS transistors, such as input/output (I/O) transistors.

DESCRIPTION OF THE DRAWINGS

One or more embodiments are illustrated by way of example, and not by limitation, in the figures of the accompanying drawings, wherein elements having the same reference numeral designations represent like elements throughout. It is emphasized that, in accordance with standard practice in the industry various features may not be drawn to scale and are used for illustration purposes only. In fact, the dimensions of the various features in the drawings may be arbitrarily increases or reduced for clarity of discussion.

DETAILED DESCRIPTION

The following disclosure provides many different embodiments, or examples, for implanting different features of the invention. Specific examples of components and arrangements are described below to simply the present disclosure. These are of course, merely examples and are not intended to be limiting.

Figure 1A:
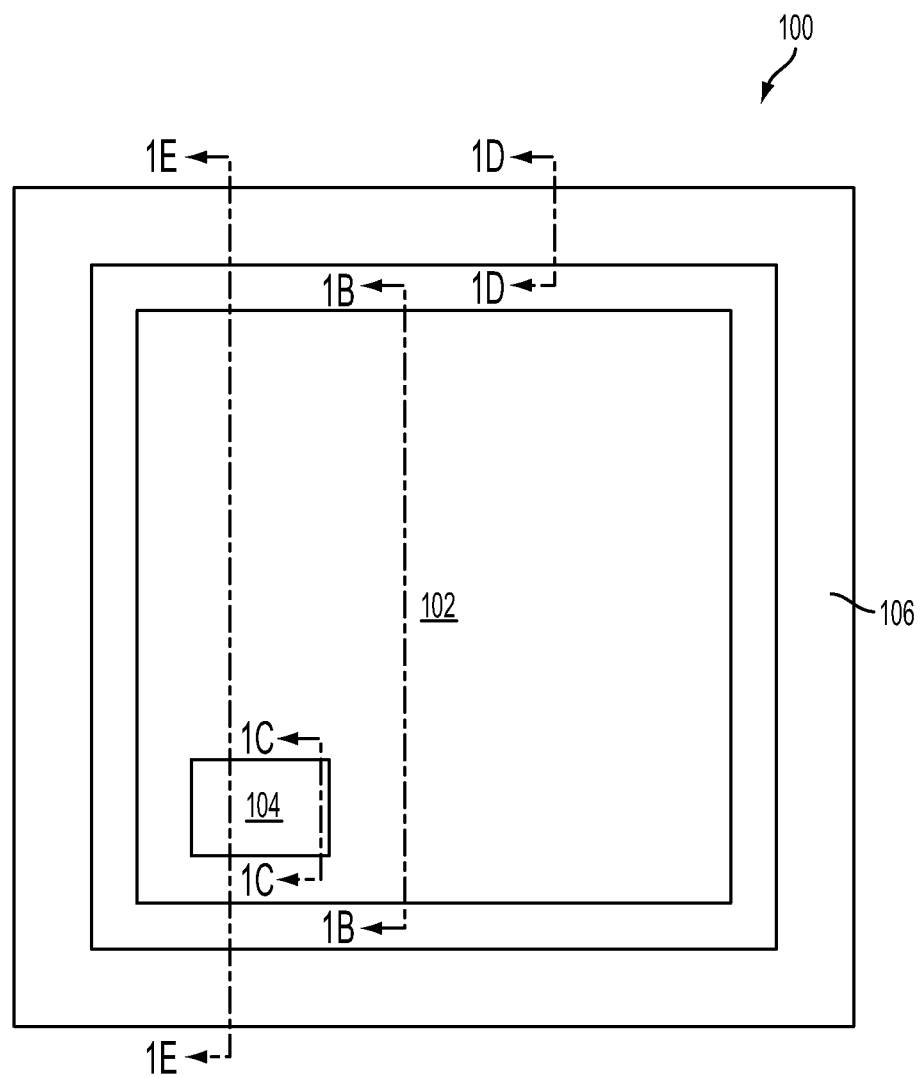
FIG. 1A is a top view of an integrated circuit (IC) having a standard region, a critical region and an input/output (I/O) region, according to one or more embodiments.

FIG. 1A depicts a top view of an integrated circuit (IC) 100 having a standard region 102, a critical region 104, and an input/output (I/O) region 106. I/O region 106 is configured to transfer signals between standard region 102 or critical region 104 and exterior devices, such as other ICs. Critical region 104 is positioned inside standard region 102. In the embodiment of FIG. 1A, critical region 104 is shown as a square. In some embodiments, critical region 104 has any number of different shapes including a free form shape. In some embodiments, IC 100 includes a single critical region 104. In some embodiments, IC 100 includes a plurality of critical regions 104. The number, shape and location of critical regions 104 are determined during the design of IC 100. In some embodiments, I/O region 106 is positioned around the exterior of standard region 104.

Critical region 104 is a portion of IC 100 having greater transistor switching speed than standard region 102. In some embodiments, an output from circuitry in critical region 104 is compared with an output from circuitry in standard region 102. If the circuitry in critical region 104 employs a greater number of comparisons than the circuit in standard region 102, then for the output of critical region 104 to arrive at a comparator at the same time as the output of standard region 102 the switching speed of transistors in critical region 104 is increased.

Figure 1B:
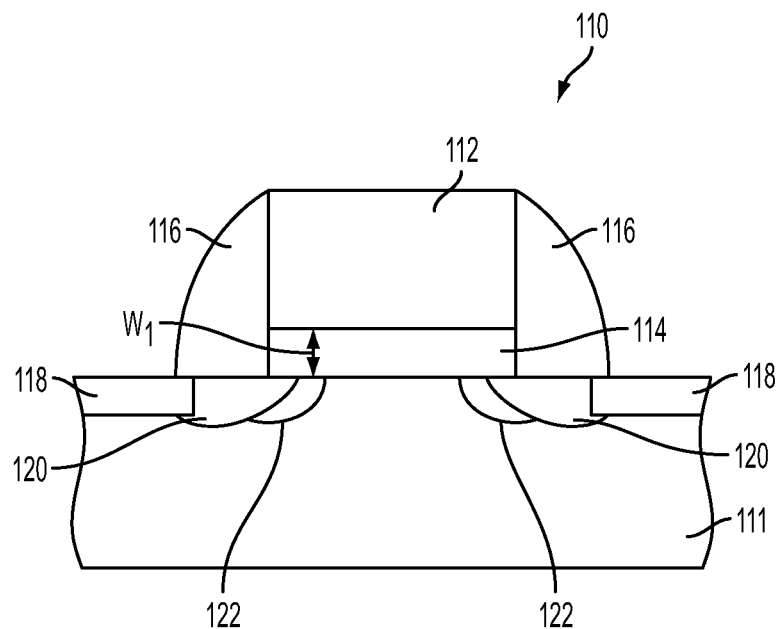
FIG. 1B is a side sectional view of a metal oxide semiconductor (MOS) transistor in the standard region taken along line 1B-1B of FIG. 1A, according to one or more embodiments.

FIG. 1B depicts a side view of a metal oxide semiconductor (MOS) transistor 110 in standard region 102 (FIG. 1A) taken along line 1B-1B of FIG. 1A. Transistor 110 includes a substrate 111 and a gate dielectric 114 over substrate 111. Transistor 110 further includes a gate electrode 112 over gate dielectric 114 and spacers 116 covering sidewalls of gate electrode 112 and gate dielectric 114. Transistor 110 further includes source and drain features 118 within substrate 111 beyond an area of substrate 111 covered by spacers 116. Transistor 110 includes lightly doped source/drain (LDD) 120 within substrate 111 extending from source and drain features 118 to an area underneath spacers 116 and gate dielectric 114. LDD 120 have a gap between therebetween, so that the source and drain features are not in contact with one another. Transistor 110 also includes pocket implantation regions 122 within substrate 111, in contact with LDD 120 and underneath gate dielectric 114. Pocket implantation regions 122 are not in direct contact with gate dielectric 114.

In some embodiments, substrate 111 comprises a silicon substrate. In some embodiments, substrate 111 comprises silicon germanium, gallium arsenic, or other suitable semiconductor materials. In some embodiments, substrate 111 comprises a semiconductor on insulator such as silicon on insulator (SOI). In some embodiments, substrate 111 is a multilayer compound semiconductor substrate.

In some embodiments, gate electrode 112 comprises polysilicon. In some embodiments, gate electrode 112 comprises aluminum, copper, alloys, or other suitable conductive material.

In some embodiments, gate dielectric 114 comprises silicon oxide. In some embodiments, gate dielectric 114 comprises a high-k dielectric layer. High k dielectric materials are materials with a dielectric constant, k, greater than 3.5, such as hafnium oxide, silicon nitride, silicon oxynitride, aluminum oxide, zirconium oxide, or other suitable dielectric materials. In some embodiments, gate dielectric 114 has a thickness, $W_1$, ranging from about 20 Angstroms to about 40 Angstroms.

In some embodiments, spacers 116 comprise silicon oxide. In some embodiments, spacers 116 comprise silicon nitride, silicon oxynitride or other suitable material.

In some embodiments, source and drain features 118 are portions of substrate 111 doped with p-type dopants, such as boron or indium, or n-type dopants, such as phosphorous or arsenic. In some embodiments, source and drain features 118 are configured for an N-type MOS (NMOS) or a P-type MOS (PMOS).

In some embodiments, LDD 120 are portions of substrate 111 doped with p-type dopants, such as boron or indium, or n-type dopants, such as phosphorous or arsenic. In some embodiments, LDD 120 comprise the same dopant as source and drain features 118. In some embodiments, LDD 120 include a different dopant material than source and drain features 118. In some embodiments, LDD 120 have a lower dopant concentration than source and drain features 118.

In some embodiments, pocket implantation regions 122 are portions of substrate 111 doped with p-type dopants, such as boron or indium, or n-type dopants, such as phosphorous or arsenic. In some embodiments, pocket implantation regions 122 include the same dopant material as source and drain features 118 and/or LDD 120. In some embodiments, pocket implantation regions 122 include a different dopant material than source and drain features 118 and/or LDD 120. In some embodiments, pocket implantation regions 122 have a dopant concentration ranging from 4.5E13 $cm^{-2}$ to 1E14 $cm^{-2}$.

Figure 1C:
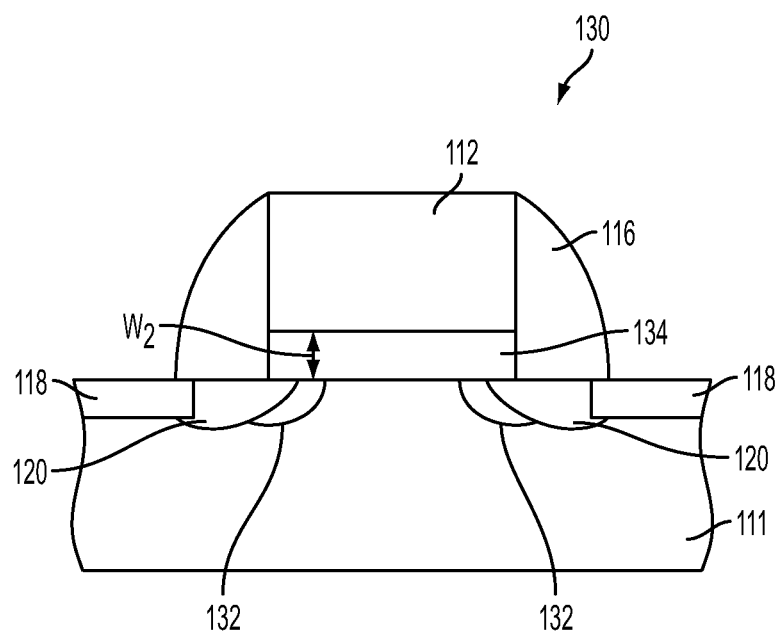
FIG. 1C is a side sectional view of a MOS transistor in the critical region taken along line 1C-1C of FIG. 1A, according to one or more embodiments.

FIG. 1C depicts a side view of a MOS transistor 130 in critical region 104 (FIG. 1A) taken along line 1C-1C of FIG. 1A. Transistor 130 has several components which are the same as transistor 110. Both transistors 110 and 130 include substrate 111, gate electrode 112, spacers 116, source and drain features 118 and LDD 120. Transistor 130 also includes a gate dielectric 134 between substrate 111 and gate electrode 112. Transistor 130 also includes pocket implantation regions 132 within substrate 111, in contact with LDD 120 and underneath gate dielectric 134.

In some embodiments, gate dielectric 134 of transistor 130 has a thickness, $W_2$, at least about 6% less than the thickness, $W_1$, of gate dielectric 114 of transistor 110. In some embodiments, the thickness, $W_2$, of gate dielectric 134 ranges from about 18 Angstroms to about 37 Angstroms. In some embodiments, gate dielectric 134 has the same composition as gate dielectric 114. In some embodiments, gate dielectric 134 has a different composition than gate dielectric 114.

In general as chip speed increases, current leakage also increases. At low speeds, a thinner gate dielectric layer exacerbates current leakage by increasing the current leakage about 20% versus a thickness of gate dielectrics similar to the thickness, $W_1$, of gate dielectric 114. However, as chip speed exceeds about 1400 MHz, the thinner gate dielectric layer reduces current leakage versus standard thickness gate dielectrics.

Figure 3:
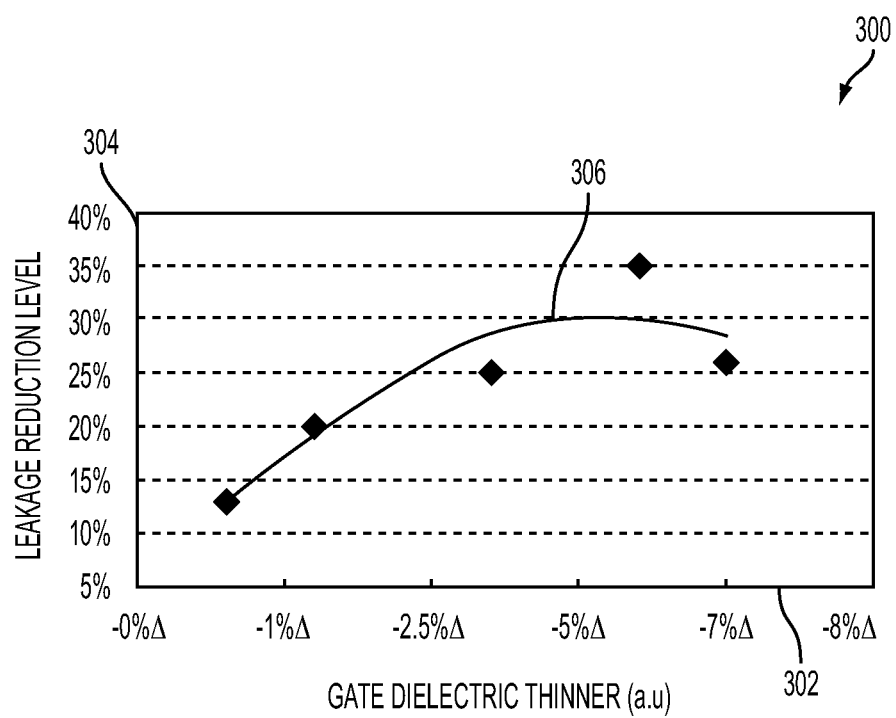
FIG. 3 is a graph of gate dielectric thickness change versus current leakage change.

FIG. 3 is a graph 300 of gate dielectric thickness change 302 versus current leakage reduction change 304. A chip speed for measuring the current leakage reduction in graph 300 is set to 1500 MHz. A curve 306 illustrates as gate dielectric thickness decreases up to about 6% the leakage reduction level also increases. The graph shows that as gate dielectric thickness is reduced by about 6% the current leakage is reduced by about 30%. Curve 306 indicates that as gate dielectric thickness reduction exceeds about 6%, the amount of leakage reduction declines.

Reducing the gate dielectric thickness also increases the risk of negative bias temperature instability (NBTI) and hot carrier injection (HCI) causing damage to transistor 130. The thickness, $W_2$, of gate dielectric 134 is selected based on consideration for both the desire for increased speed with reliability problems associated with NBTI and HCI. In some embodiments, when a small amount of increased speed is desired, in comparison with a standard transistor, the thickness, $W_2$, of gate dielectric 134 is reduced by less than 6% in comparison to the thickness, $W_1$, of gate dielectric 114. In some embodiments, when a high amount of increased speed is desired, in comparison with a standard transistor, the thickness, $W_2$, of gate dielectric 134 is reduced by about 6% in comparison to the thickness, $W_1$, of gate dielectric 114.

In some embodiments, pocket implantation regions 132 of transistor 130 have the same size and doping concentration as pocket implantation regions 122 of transistor 110. In some embodiments, pocket implantation regions 132 have a lower doping concentration than pocket implantation regions 122.

Figure 1D:
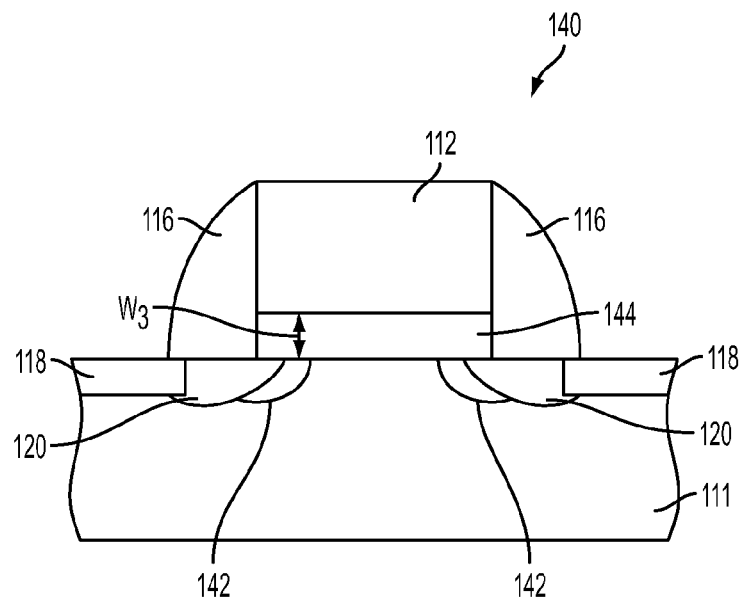
FIG. 1D is a side sectional view of a MOS transistor in the I/O region taken along line 1D-1D of FIG. 1A, according to one or more embodiments.

FIG. 1D depicts an I/O region MOS transistor 140 taken along line 1D-1D of FIG. 1A. Transistor 140 has a similar structure to transistor 110. Both transistors 110 and 140 include substrate 111, gate electrode 112, spacers 116, source and drain features 118 and LDD 120. Transistor 140 also includes a gate dielectric 144 between substrate 111 and gate electrode 112. Gate dielectric 144 of transistor 140 has a thickness, $W_3$, which is thicker than gate dielectric 114 of transistor 110. In some embodiments, gate dielectric 144 is about 10% thicker than gate dielectric 114. In some embodiments, the thickness of gate dielectric 144 ranges from about 30 Angstroms to about 85 Angstroms. The thickness of gate dielectric 144 is selected based on a voltage applied to I/O region MOS transistor 140. A higher voltage applied to I/O region MOS transistor 140, results in a thicker gate dielectric 144.

Transistor 140 also includes pocket implantation regions 142 within substrate 111, in contact with LDD 120 and underneath gate dielectric 144. In some embodiments, pocket implantation regions 142 of transistor 140 have the same size and doping concentration as pocket implantation regions 122 of transistor 110. In some embodiments, pocket implantation regions 142 have a lower doping concentration than pocket implantation regions 122.

Figure 1E:
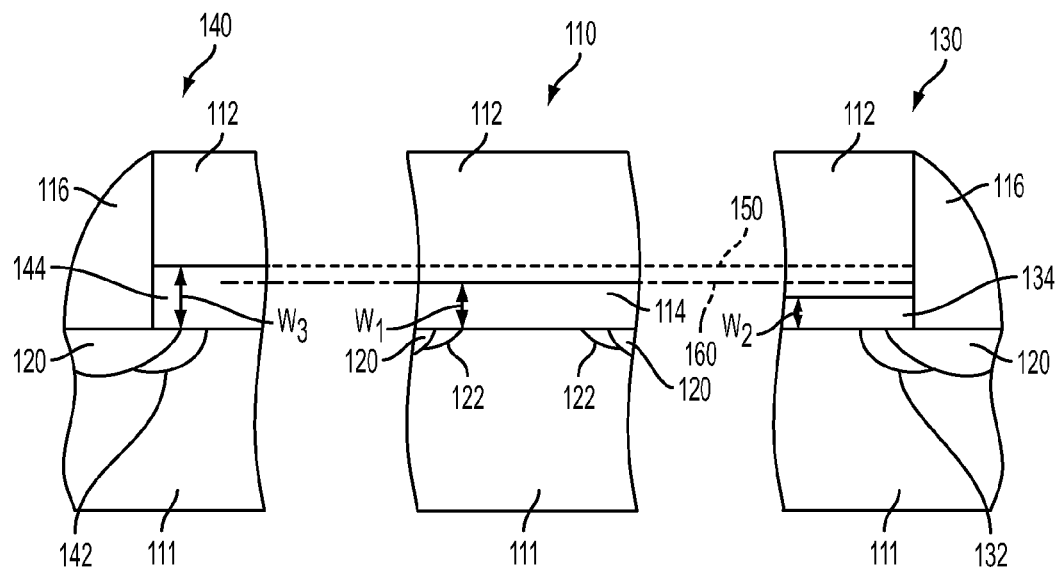
FIG. 1E is a side sectional view comparing the MOS transistors of the standard region, the critical region and the I/O region of the FIG. 1A embodiment taken along line 1E-1E of FIG. 1A.

FIG. 1E is a side sectional view taken along line 1E-1E of FIG. 1A comparing transistor 110 of standard region 102, transistor 130 of critical region 104 and transistor 140 of I/O region 106 taken along line A-A of FIG. 1A. A dotted line 150 indicates the thickness, $W_3$, gate dielectric 144 of transistor 140 is greater than the thickness, $W_1$, of gate dielectric 114 of transistor 110 and the thickness, $W_2$, of gate dielectric 134 of transistor 130. A chain-dot line 160 indicates the thickness, $W_1$, of gate dielectric 114 of transistor 110 is greater than the thickness, $W_2$, of gate dielectric 134 of transistor 130.

Figure 2:
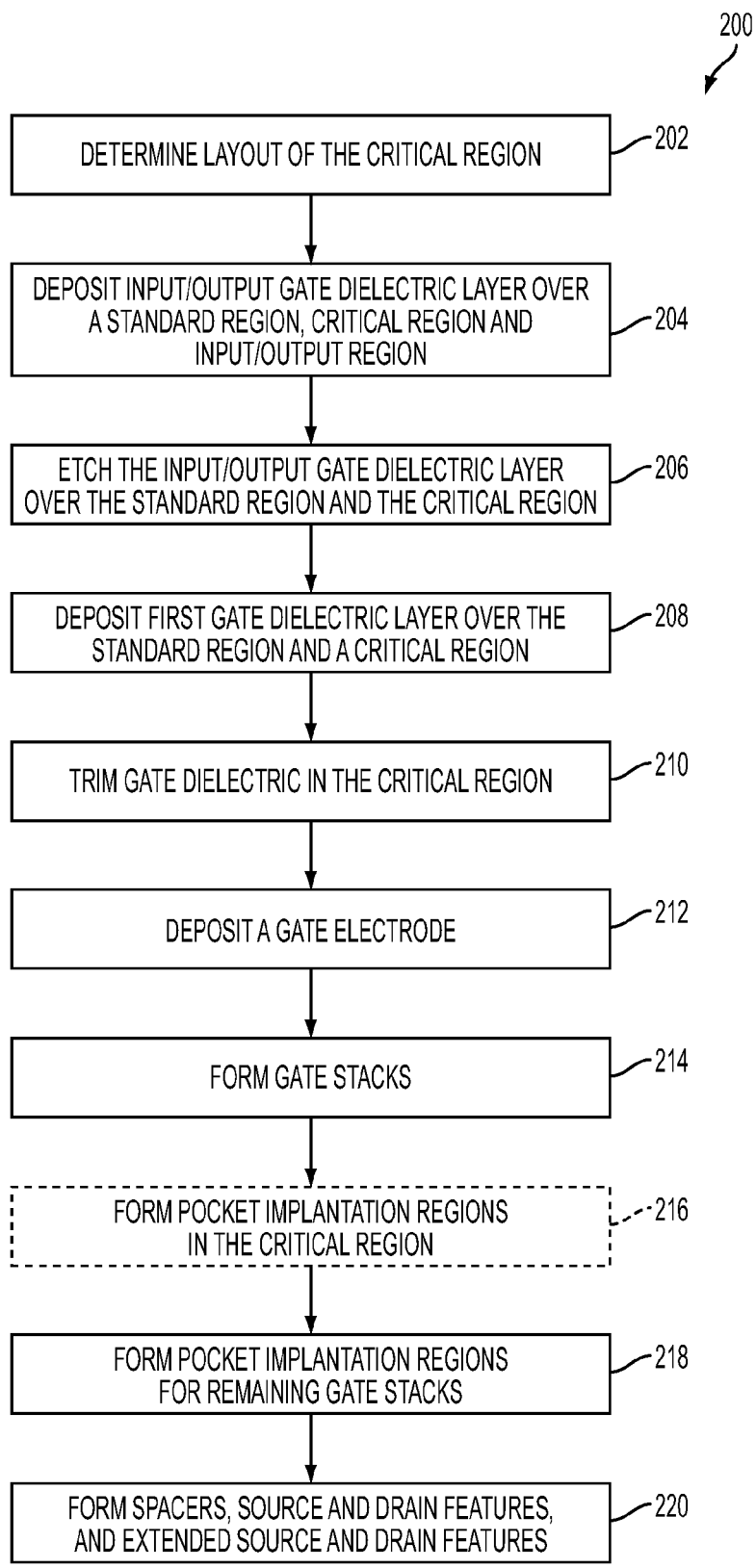
FIG. 2 is a flow chart of a method of making an IC having a standard logic region and a critical region, according to one or more embodiments.

FIG. 2 depicts a flow chart of a method 200 for forming IC 100, according to one or more embodiments. Method 200 includes operation 202 in which critical region 104 is determined. Method 200 continues with operation 204, in which an I/O gate dielectric layer is deposited over IC 100 including I/O region 106 standard region 102 and critical region 104. In operation 206, the I/O gate dielectric layer over standard region 102 and critical region 104 is etched. In operation 208, a first gate dielectric layer 402 (FIG. 4A) is deposited over the standard region 102, including critical region 104. Method 200 continues with operation 210, where critical region 104 undergoes gate dielectric trimming to form a second gate dielectric layer 408 (FIG. 4C,E). Method 200 continues with operation 212, in which gate electrode layer is deposited over both standard region 102 and critical region 104. In operation 214 of method 200, the gate electrode layer and first and second gate dielectric layers 402 and 408 are etched to form gate stacks. Method 200 continues with optional operation 216, in which pocket implantation regions 132 having smaller size or lower doping concentration are formed in critical region 104. Method 200 continues with operation 218, in which pocket implantation regions are formed in the remaining transistors of IC 100. Method 200 continues with operation 220 in which spacers 116, source and drain features 118 and LDD 120 are formed.

In operation 202, critical region 104 is determined. In some embodiments, the determination includes selecting a number of critical regions, a location of critical region 104, a size of critical region 104 and a shape of critical region 104. In some embodiments, one critical region 104 is selected. In some embodiments, a plurality of critical regions 104 is selected. In some embodiments, the determination of critical region 104 is performed by a designer of IC 100. In some embodiments, individual transistors separate from critical region 104 in IC 100 are formed with the structure of the MOS transistor 130 to enhance the speed of the individual transistors.

In operation 204, the I/O gate dielectric layer is deposited over standard region 102, critical region 104 and I/O region 106. In some embodiments, the material for the I/O gate dielectric layer is the same as gate dielectric 114. In some embodiments, a thickness for the I/O gate dielectric layer ranges from about 30 Angstroms to about 85 Angstroms. physical vapor deposition (PVD). In some embodiments, the first gate dielectric layer is deposited using chemical vapor deposition (CVD), sputtering, or another suitable deposition method.

In operation 206, the I/O gate dielectric layer over standard region 102 and critical region 104 is etched. In some embodiments, the I/O gate dielectric layer is etched to completely remove the I/O gate dielectric layer over standard region 102 and critical region 104. In some embodiments, the I/O gate dielectric layer is etched to reduce a thickness of the I/O gate dielectric layer over standard region 102 and critical region 104, but not to completely remove the I/O gate dielectric layer. In some embodiments, the etching of the I/O gate dielectric layer includes the use of a photoresist or a hard mask to define etching boundaries.

In some embodiments, the etching is dry etching, wet etching, plasma etching or another suitable etching process.

In operation 208, first gate dielectric layer 402 (FIG. 4A) is deposited over standard region 102 and critical region 104. In some embodiments, the material for first gate dielectric layer 402 is the same as gate dielectric 114. In some embodiments, a thickness for first gate dielectric layer 402 ranges from about 20 Angstroms to about 40 Angstroms. In some embodiments, first gate dielectric layer 402 is deposited using PVD. In some embodiments, the first gate dielectric layer is deposited using CVD, sputtering, or another suitable deposition method. Following operation 202, first gate dielectric layer 402 has a substantially uniform thickness over both standard region 102 and critical region 104.

Following deposition of first gate dielectric layer 402, first gate dielectric layer 402 over critical region 104 undergoes gate dielectric trimming in operation 210. In some embodiments, gate dielectric trimming includes depositing a photoresist 404 (FIG. 4B) over IC 100, patterning photoresist 404 and etching first dielectric layer 402.

Figure 4A:
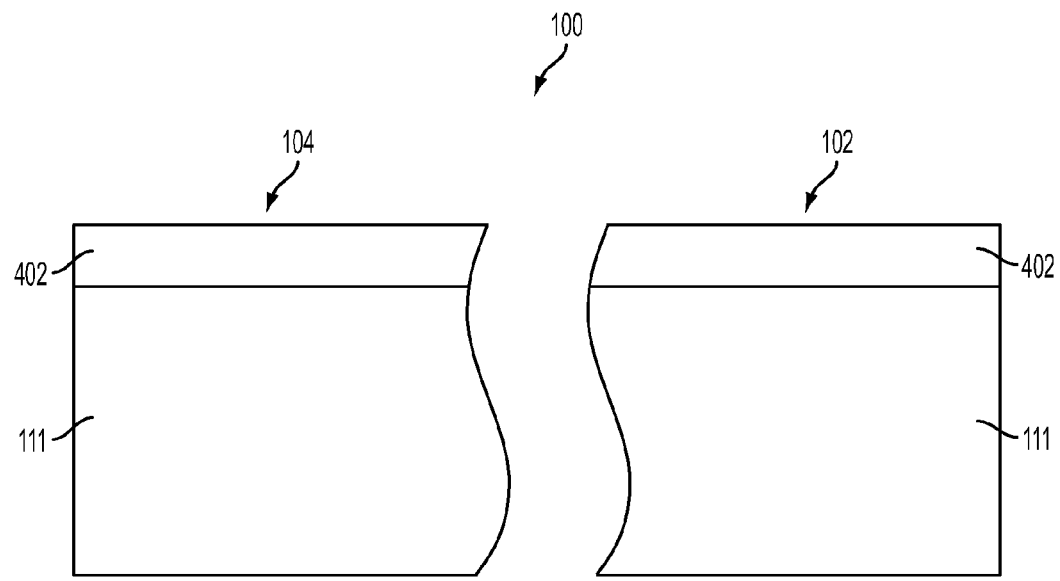
FIGS. 4A-4E are side views of the standard region and the critical region during various stages of a gate dielectric trimming process, according to one or more embodiments.

FIG. 4A depicts standard region 104 and critical region 102 after operation 208. The first gate dielectric layer 402 is over substrate 111. The thickness of first gate dielectric layer 402 is the same in both the standard region 102 and the critical region 104.

Figure 4B:
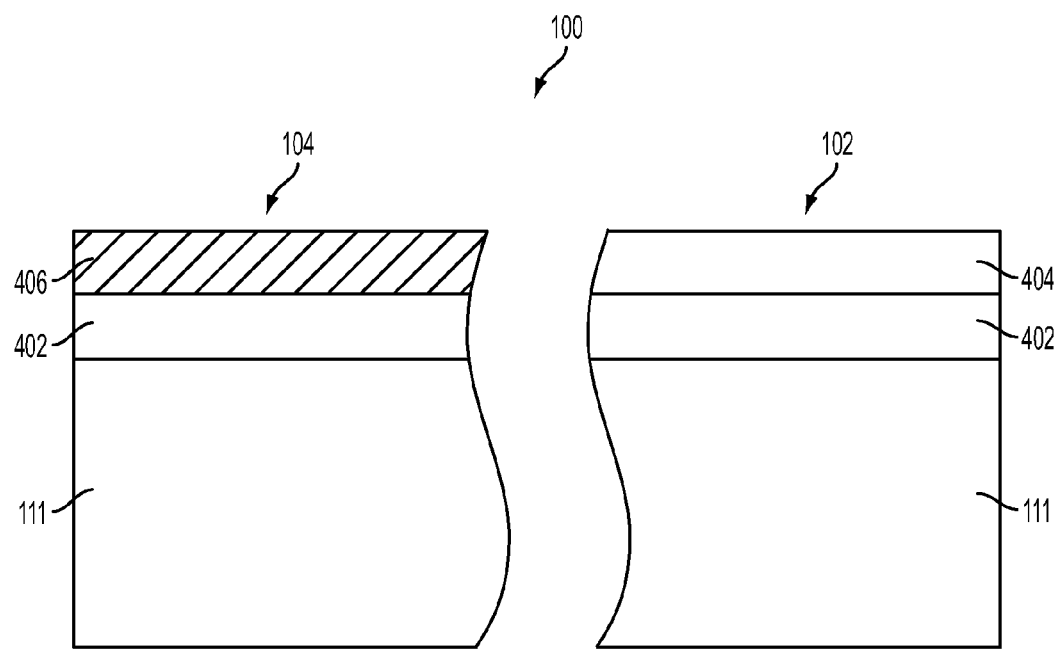
Figure 4C:
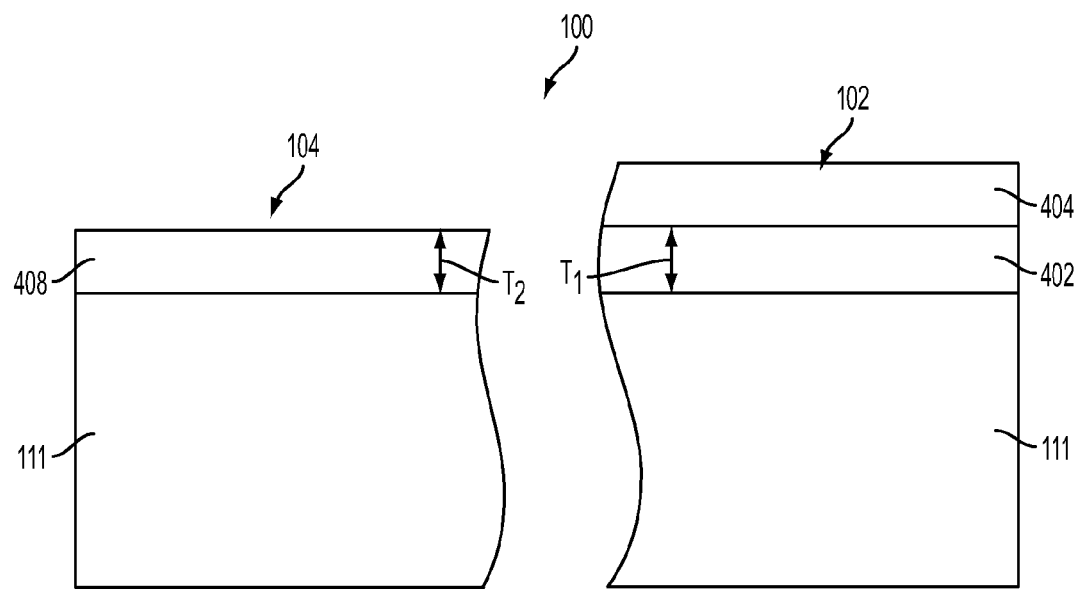

In some embodiments, photoresist 404 is deposited over IC 100 by a spin-on deposition method. In some embodiments, photoresist 404 is deposited over IC 100 by PVD, sputtering, or another suitable deposition method. In some embodiments, photoresist 404 is a positive photoresist material. In some embodiment, photoresist 404 is a negative photoresist material. Following deposition of photoresist 404, photoresist 404 is patterned using a patterning mask, to form a patterned photoresist 406 (FIG. 4B). In some embodiments, ultraviolet light passes through the patterning mask to pattern photoresist 404. In some embodiments, thermal energy or other suitable patterning energy passes through the patterning mask to pattern photoresist 404. The pattern on the photoresist substantially matches the layout of critical region 104.

FIG. 4B depicts standard region 102 and critical region 104 following patterning of photoresist 404. In the embodiment shown in FIG. 4B, patterned photoresist 406 is over critical region 104. Photoresist 404 over standard region 102 is not patterned.

Following the patterning of photoresist 404, patterned photoresist 406 and the first gate dielectric layer 402 over critical region 104 are etched. In some embodiments, the etching is dry etching, wet etching, plasma etching or another suitable etching process.

In some embodiments, first gate dielectric layer 402 over critical region 104 is etched until a desired thickness is obtained, forming a second dielectric layer 408. FIG. 4C depicts standard region 102 and critical region 104 after etching a portion of the first dielectric layer 402 to form second dielectric layer 408. In some embodiments, second dielectric layer 408 has a thickness, $T_2$, which is about 6% less than a thickness, $T_1$, of first dielectric layer 402. In some embodiments, thickness, $T_2$, ranges from about 18 Angstroms to about 37 Angstroms. Because second dielectric layer 408 is formed by etching the portion of first dielectric layer 402, first dielectric layer 402 and second dielectric layer 408 have the same composition.

Figure 4D:
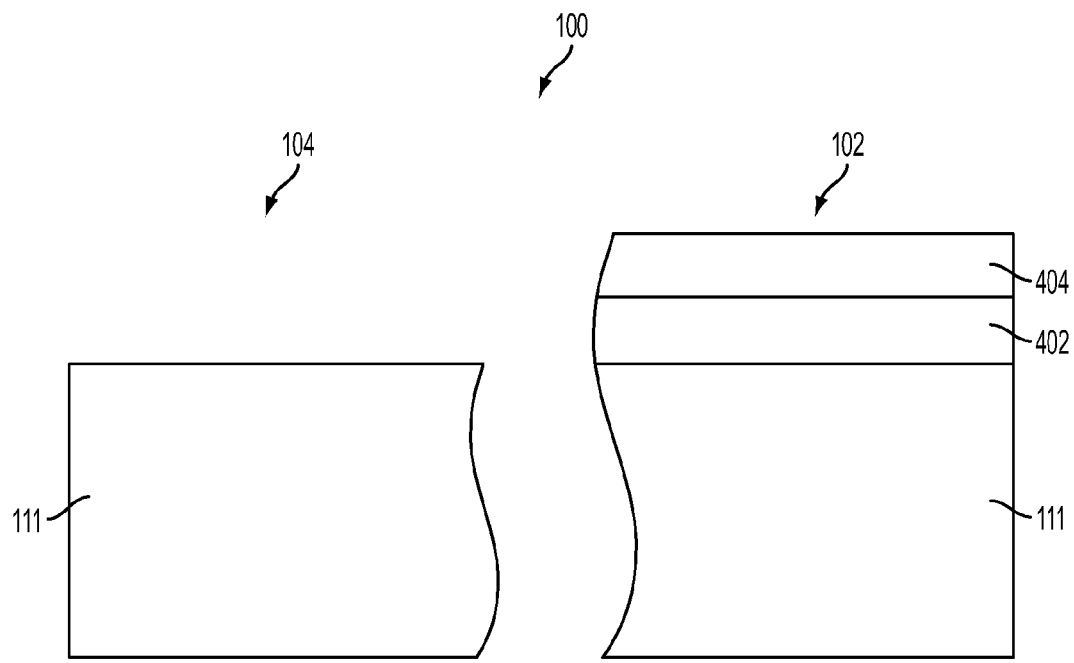
Figure 4E:
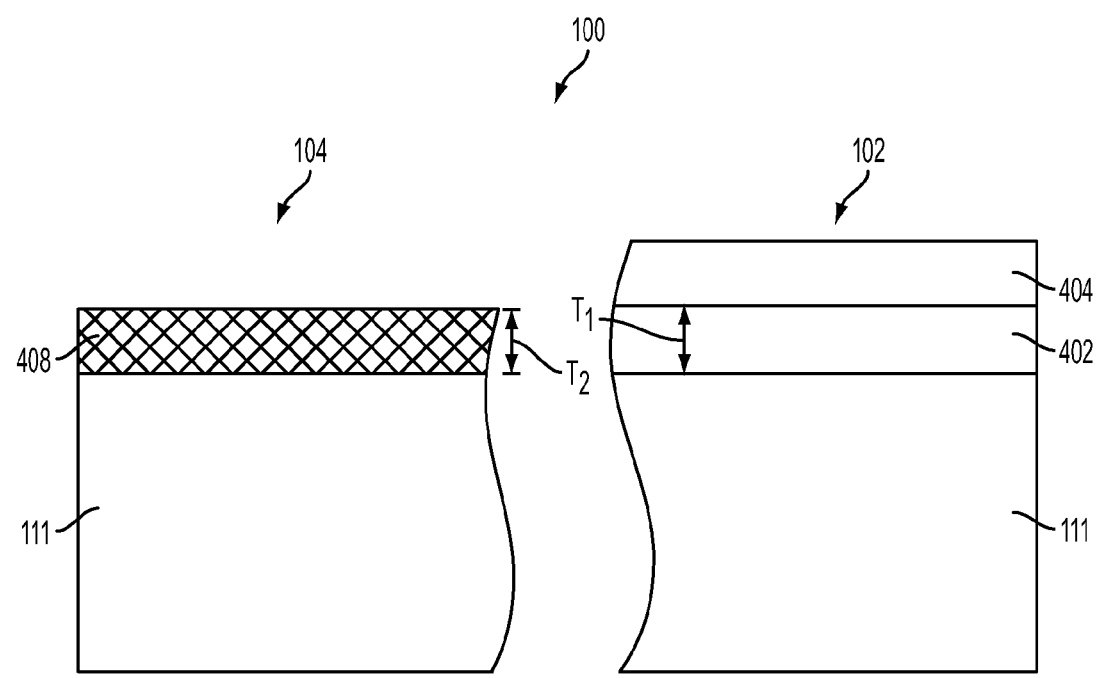

In some embodiments, substantially all of first gate dielectric layer 402 is removed during the etching process. If the substantially all of first gate dielectric layer is removed, then second gate dielectric layer 408 is deposited into an at least one opening defined by the removal of first gate dielectric layer 402. FIG. 4D depicts standard region 102 and critical region 104 following removal of substantially all of first dielectric layer 402. In some embodiments, the deposition process is the same as the deposition process in operation 208. In some embodiments, the deposition process is different than the deposition process in operation 208. FIG. 4E depicts standard region 102 and critical region 104 following deposition of second dielectric layer 408. In some embodiments, second dielectric layer 408 has a thickness, $T_2$, which is about 6% less than a thickness, $T_1$, of first dielectric layer 402. In some embodiments, thickness, $T_2$, ranges from about 18 Angstroms to about 37 Angstroms. Because substantially all of first dielectric layer 402 is removed and then second dielectric layer 408 is deposited, in some embodiments, second dielectric layer 408 has a different composition than first dielectric layer 402.

After forming second dielectric layer 408, photoresist 404 is removed. In some embodiments, photoresist 404 is removed using an etching process, plasma ashing, or another suitable photoresist removal process. Following operation 210, the thickness of second gate dielectric layer 408 in critical region 104 is less than the thickness of first gate dielectric layer 402 over standard region 102.

Method 200 continues with operation 212 in which the gate electrode layer is deposited over first dielectric layer 402 and second gate dielectric layers 408. In some embodiments, the gate electrode layer is deposited to form a uniform height from substrate 111. The gate electrode layer in critical region 104 is thus thicker than the gate electrode layer over standard region 102. In some embodiments, gate electrode layer is deposited by CVD or another suitable deposition process.

In operation 214, the gate electrode layer, first gate dielectric layer 402 and second gate dielectric layer 408 are patterned and etched to form gate stacks which define the location of transistors in standard region 102 and critical region 104. In some embodiments, the patterning process is the same as the patterning process in operation 210. In some embodiments, the etching process is a wet etching process, a dry etching process, a plasma etching process, or another suitable etching process. The gate stacks for transistors 110 in standard region 102 comprise gate dielectric 114 and gate electrode 112. The gate stacks for transistors 130 in critical region 104 comprise gate dielectric 134 and gate electrode 112.

In optional operation 216, pocket implantation regions are formed in critical region 104. Optional operation 216 is executed if additional switching speed, above the speed afforded by the gate dielectric trimming in operation 210, is desired for critical region 104. In some embodiments, the pocket implantation regions are formed by a tilted ion-beam implantation. In some embodiments, the dopants in the pocket implantation regions are the same as pocket implantation regions 132. In some embodiments, the tilt angle is up to about 50-degrees. In some embodiments, the implant voltage is less than about 200 kev. In some embodiments, the implant dosage is less than about $1E14^{cm-2}$. In some embodiments, the implant dosage is about $3E13^{cm-2}$.

Method 200 continues with operation 218 in which pocket implantation regions for the remaining portion of IC 100 are formed. If operation 216 is not executed, the pocket implantation process for the standard region 102 and the critical region 102 are the same. In such instances, pocket implantation regions 132 of transistor 130 and pocket implantation regions 122 of transistor 110 are the same. If operation 216 is executed the, pocket implantation regions 132 of transistor 130 and pocket implantation regions 122 of transistor 110 are different. Pocket implant regions 142 are also formed in operation 218. In some embodiments, the implantation voltage and tilt angle in operation 218 is the same as the implantation voltage and tilt angle in operation 216. In some embodiments, the implantation voltage and tilt angle in operation 218 is different than the implantation voltage and tilt angle in operation 216. In some embodiments, the implant dosage in operation 218 is higher than the implant dosage in operation 216. In some embodiments, the pocket implantation regions formed in operation 218 are larger and/or have a higher dopant concentration than the pocket implantation regions formed in optional operation 216.

In operation 220, spacers 116, source and drain features 118 and LDD 120 are formed. In some embodiments, spacers 116 are formed by depositing a layer of spacer material from those discussed above and etching the layer of spacer material to form spacers 116. In some embodiments, source and drain features 118 are formed by ion implantation. In some embodiments, source and drain features are formed by etching an opening in substrate 111 and depositing a doped material into the opening in substrate 111. In some embodiments, LDD 120 are formed by ion implantation. In some embodiments, extended source and drain features are formed by an annealing process.

The above description describes an integrated circuit which has increased switching speed in the critical region of the integrated circuit. The integrated circuit includes three different regions, and each region includes transistors having a gate dielectric thickness different than the gate dielectric thickness of transistors in the other two regions. The integrated circuit as described above achieves the increased switching speed in the critical region while reducing current leakage within the critical regions of the integrated circuit in comparison with conventional integrated circuits. In some embodiments, the integrated circuit also includes pocket implantation regions. In some embodiments, the pocket implantation regions in the different regions of the integrated circuit have different dopant concentrations or different dimensions.

One aspect of this description relates to an integrated circuit having a first transistor having a first gate dielectric layer with a first thickness. The integrated circuit also includes a second transistor having a second gate dielectric layer with a second thickness and the second transistor is configured to electrically connect to the first transistor. The integrated circuit further includes a third transistor having a third gate dielectric layer with a third thickness and the third transistor is configured to electrically connect to at least one of the first transistor or the second transistor. The thickness of the first gate dielectric layer, the thickness of the second gate dielectric layer and the thickness of the third gate dielectric layer are all different from one another.

Another aspect of this description relates to an integrated circuit including a first transistor, a second transistor and a third transistor. The first transistor having a first gate dielectric layer having a first thickness. The second transistor having a second gate dielectric layer having a second thickness. The third transistor having a third gate dielectric layer having a third thickness. The first thickness is at least about 6% less than the second thickness.

Still another aspect of this description relates to a method of forming an integrated circuit including forming a first transistor having a first gate dielectric layer with a first thickness. The method also includes forming a second transistor having a second gate dielectric layer with a second thickness. The method further includes forming a third transistor having a third gate dielectric layer with a third thickness. The thickness of the first gate dielectric layer, the thickness of the second gate dielectric layer and the thickness of the third gate dielectric layer are all different.

It will be readily seen by one of ordinary skill in the art that the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. An integrated circuit comprising:
   a first transistor having a first gate dielectric layer, wherein the first gate dielectric layer has a first thickness, and the first transistor is in a first critical region;
   a second transistor having a second gate dielectric layer, wherein the second gate dielectric layer has a second thickness, the second transistor is in a standard region of the integrated circuit, the first critical region is within the standard region, and the second transistor is configured to electrically connect to the first transistor, and the second transistor is configured to electrically connect to the first transistor;
   a third transistor having a third gate dielectric layer, wherein the third gate dielectric layer has a third thickness greater than the first thickness and the second thickness, and the third transistor is configured to electrically connect to at least one of the first transistor or the second transistor; and
   a fourth transistor having a fourth gate dielectric layer, wherein the fourth gate dielectric layer has the first thickness, the fourth transistor is in a second critical region separate from the first critical region, and the second critical region is within the standard region,
   wherein the first thickness, the second thickness and the third thickness are all different, and the first thickness is at least about 6% less than the second thickness, and a switching speed of the first transistor is at least 1400 MHz.

2. The integrated circuit of claim 1, wherein the first thickness is at least 6% less than the second thickness.

3. The integrated circuit of claim 1, wherein the first gate dielectric layer, the second gate dielectric layer and the third gate dielectric layer have the same composition.

4. The integrated circuit of claim 1, wherein at least one of the first gate dielectric layer, the second gate dielectric layer or the third gate dielectric layer has a different composition than another of the first gate dielectric layer, the second gate dielectric layer and the third gate dielectric layer.

5. The integrated circuit of claim 1, further comprising
   a first pocket implantation region in the first transistor, wherein the first pocket implantation region has a first dopant concentration;
   a second pocket implantation region in the second transistor, wherein the second pocket implantation region has a second dopant concentration; and
   a third pocket implantation region in the third transistor, wherein the third pocket implantation region has a third dopant concentration.

6. The integrated circuit of claim 5, wherein the first dopant concentration is less than both of the second dopant concentration and the third dopant concentration.

7. The integrated circuit of claim 1, wherein the first thickness ranges from about 18 Angstroms to about 37 Angstroms, the second thickness ranges from about 20 Angstroms to about 40 Angstroms, and the first thickness is at least about 6% less than the second thickness.

8. An integrated circuit comprising:
   a plurality of critical regions, each critical region of the plurality of critical regions comprising a first transistor having a first gate dielectric layer, wherein the first gate dielectric layer has a first thickness;
   a standard region surrounding each critical region of the plurality of critical regions, wherein the standard region comprises a second transistor having a second gate dielectric layer, wherein the second gate dielectric layer has a second thickness, the second transistor is configured to electrically connect to the first transistor of at least one critical region of the plurality of critical regions, and a portion of the standard region is located between adjacent critical regions of the plurality of critical regions; and
   an input/output (I/O) region surrounding the standard region, wherein the I/O region comprises a third transistor having a third gate dielectric layer, wherein the third gate dielectric layer has a third thickness greater than the first thickness and the second thickness, and the third transistor is configured to electrically connect to the second transistor,
   wherein the first thickness is at least about 6% less than the second thickness, and a switching speed of the first transistor is at least 1400 MHz.

9. The integrated circuit of claim 8, wherein the first gate dielectric layer, the second gate dielectric layer and the third gate dielectric layer have the same composition.

10. The integrated circuit of claim 8, wherein at least one of the first gate dielectric layer, the second gate dielectric layer or the third gate dielectric layer has a different composition than another of the first gate dielectric layer, the second gate dielectric layer and the third gate dielectric layer.

11. The integrated circuit of claim 8, further comprising
    a first pocket implantation region in the first transistor of each critical region of the plurality of critical regions, wherein the first pocket implantation region has a first dopant concentration;
    a second pocket implantation region in the second transistor, wherein the second pocket implantation region has a second dopant concentration; and
    a third pocket implantation region in the third transistor, wherein the third pocket implantation region has a third dopant concentration.

12. The integrated circuit of claim 8, wherein the first dopant concentration is less than both of the second dopant concentration and the third dopant concentration.

13. The integrated circuit of claim 8, wherein the first thickness ranges from about 18 Angstroms to about 37 Angstroms, and the second thickness ranges from about 20 Angstroms to about 40 Angstroms.

14. An integrated circuit comprising:
    a plurality of critical regions, wherein each critical region of the plurality of critical regions comprises a first transistor having a first pocket implant region and a first gate dielectric layer having a first thickness, wherein the first pocket implant region has a first dopant concentration, and each critical region of the plurality of critical regions is physically separated from another critical region of the plurality of critical regions;

a standard region surrounding each critical region of the plurality of critical regions, wherein the standard region comprises a second transistor having a second pocket implant region and a second gate dielectric layer having a second thickness, wherein the second pocket implant region has a second dopant concentration; and an input/output (I/O) surrounding the standard region, wherein the I/O region comprises a third transistor having a third pocket implant region, wherein the third pocket implant region has a third dopant concentration, a thickness of a gate dielectric for the third transistor is greater than a thickness of a gate dielectric for the first transistor of each critical region of the plurality of critical regions and a thickness of a gate dielectric for the second transistor, and the third transistor is configured to electrically connect to the second transistor, wherein the first dopant concentration is greater than at least one of the second dopant concentration or the third dopant concentration, and the first thickness is at least about 6% less than the second thickness, and a switching speed of the first transistor is at least 1400 MHz.

15. The integrated circuit of claim 14, wherein the first dopant concentration ranges from about $4.5E13$ $cm^{-2}$ to about $1E14$ $cm^{-2}$.

16. The integrated circuit of claim 14, wherein the first dopant concentration is greater than both the second dopant concentration and the third dopant concentration.

17. The integrated circuit of claim 14, wherein a size of the first pocket implant region is a same size of at least one of the a size of the second pocket implant region or a size of the third pocket implant region.

18. The integrated circuit of claim 8, wherein a shape of a first critical region of the plurality of critical regions is different from a shape of a second critical region of the plurality of critical regions.

19. The integrated circuit of claim 8, wherein a switching speed of the first transistor in each critical region of the plurality of critical regions is faster than a switching speed of the second transistor.

* * * * *